(12) United States Patent
Bodas (10) Patent No.: US 7,210,048 B2
(45) Date of Patent: Apr. 24, 2007

(54) ENTERPRISE POWER AND THERMAL MANAGEMENT

(75) Inventor: Devadatta V. Bodas, Federal Way, WA (US)

(73) Assignee: Intel Corporation, Santa Clara, CA (US)

( * ) Notice: Subject to any disclaimer, the term of this patent is extended or adjusted under 35 U.S.C. 154(b) by 588 days.

(21) Appl. No.: 10/367,387

(22) Filed: Feb. 14, 2003

(65) Prior Publication Data

US 2004/0163001 A1   Aug. 19, 2004

(51) Int. Cl.
*G06F 1/26* (2006.01)
(52) U.S. Cl. .............. 713/320; 713/300; 713/310; 713/321; 713/322; 713/323; 713/324; 713/330; 713/340
(58) Field of Classification Search .......... 713/300, 713/320–324, 310, 330, 340
See application file for complete search history.

(56) References Cited

U.S. PATENT DOCUMENTS

| | | | | |
|---|---|---|---|---|
| 6,223,056 | B1* | 4/2001 | Appel | 455/561 |
| 6,526,516 | B1* | 2/2003 | Ishikawa et al. | 713/340 |
| 6,952,782 | B2* | 10/2005 | Staiger | 713/300 |
| 2003/0005339 | A1* | 1/2003 | Cohen et al. | 713/300 |
| 2003/0065958 | A1* | 4/2003 | Hansen et al. | 713/300 |
| 2003/0122429 | A1* | 7/2003 | Zhang et al. | 307/43 |
| 2004/0003303 | A1* | 1/2004 | Oehler et al. | 713/300 |
| 2004/0104709 | A1* | 6/2004 | Yamaji et al. | 320/150 |

FOREIGN PATENT DOCUMENTS

GB     EP001096360 A1 *  5/2001

OTHER PUBLICATIONS

Bodas, Devadatta V., ", Method and Apparatus to Manage Use of System Power Within a Given Specification", U.S. Appl. No. 10/037,391, filed Jan. 2, 2002.
Bovet, Daniel et al., "Reducing Power Consumption on Your Linux Box", www.linux.oreilly.com, Nov. 29, 2000, O'Reilly & Associates, Sebastopol, CA USA.

* cited by examiner

*Primary Examiner*—A. Elamin (57) ABSTRACT

Power consumption by a computer system may vary all the time based upon software and the workload. Facility such as data centers host multiple of computer systems. With continuous growing demand for power and cooling of computer systems, data centers face limitations on their ability to provide the power and cooling capability. These limitations are occasionally exasperated by problems in either power or cooling systems. The computer systems may have a method to maintain total power consumption below a set target level. An enterprise power and thermal manager, EPTM, may change this setting dynamically to improve efficiency of supporting power and cooling infrastructure. In addition, the EPTM may use this ability to improve performance, availability and to provide ability to implement various administrative policies.

50 Claims, 9 Drawing Sheets

ENTERPRISE POWER AND THERMAL MANAGEMENT

RELATED APPLICATIONS

This application is related to a pending application titled "METHOD AND APPARATUS TO MANAGE USE OF SYSTEM POWER WITHIN A GIVEN SPECIFICATION" filed on Jan. 02, 2002 having Ser. No. 10/037,391, and a pending application titled "METHOD TO ESTIMATE POWER AND COOLING REQUIREMENTS OF SYSTEMS" filed on Dec. 13, 2001 having Ser. No. 10/022,448.

FIELD OF THE INVENTION

The present invention relates generally to field of system management. More specifically, the present invention relates to methods and apparatuses for managing performance, power, thermal and other properties of computer systems.

BACKGROUND

Generally, it is difficult to measure power usage of computer systems in all the possible scenarios. Many new usage models, applications and data patterns are discovered on a regular basis. When a new usage model makes the components of a computer system demand more power than what the power supply can provide, the power supply and accordingly the computer system may fail.

For many computer systems, power specification is based upon analytical models. Such analytical models make certain assumptions on the distribution of power usage by various components of the computer systems. The power specification may be a sum of maximum estimated power consumption of all the components. A power supply may be designed to support this estimated power consumption.

Computer system manufacturers typically provide a power rating or power specification for each of their computer systems. The power specification is based on the maximum estimated power consumption of the components in the computer system. The power specification thus indicates the maximum power that the power supply of the computer system should be able to handle and may be referred to as $P_{MAX}$. In the process of determining a value of $P_{MAX}$, computer system designers usually consider a worst-case configuration, which typically means that $P_{MAX}$ is given a value that is based on a computer system fully populated with components.

Furthermore, the value of $P_{MAX}$ may also be based on an assumption that the computer system is configured with the most power hungry components including hardware and software components. For example, a server computer system may be designed to support four processors that may run at between 1.5 GHz and 2.2 GHz, 12 slots of memory, 8 slots for input/output (I/O) adapters and 5 bays for hard drives. The value of $P_{MAX}$ for such a computer system assumes that it is populated with four 2.2 GHz (max power) processors, fully utilized memory slots and I/O slots, and five hard drives. To make the matter worse, computer system designers may include a guard band to reduce probability for system failure. For example, a power supply may have a maximum rating that is a percentage (e.g., 20 percent) higher than the estimated power consumption, resulting in inflated estimated power consumption.

Over designed power supply may drive higher demand on associated infrastructures. This is evident in data centers where computer systems are typically installed on racks. Each rack has limited power and cooling capacity. Many times data center administrators use the inflated estimated power consumption (e.g., based on name plate specification) to determine the number of computer systems that can go on a rack. With the power specification growing in every computer generation, the number of computer systems that can be supported by the rack decreases. As a result, there are more and more empty spaces on the rack. In addition, an over design power supply is unnecessarily expensive.

BRIEF DESCRIPTION OF THE DRAWINGS

The present invention is illustrated by way of example, and not limitation, in the figures of the accompanying drawings in which like references indicate similar elements and in which.

DETAILED DESCRIPTION

For one embodiment, methods and apparatus for improving efficiency of supporting infrastructure for one or more computer systems are disclosed. Power consumption in a computer system may vary at different levels depending on power consumption of components in the computer system at different times. A target power consumption level may be set for the computer system. When a current power consumption level of the computer system is near the target power consumption level, the computer system may be allocated additional power.

In the following description, for purposes of explanation, numerous specific details are set forth to provide a thorough understanding of the present invention. It will be evident, however, to one skilled in the art that the present invention may be practiced without these specific details. In other instances, well known structures, processes, and devices are shown in block diagram form or are referred to in a summary manner in order to provide an explanation without undue detail.

Target Power Consumption Level

Figure 1A:
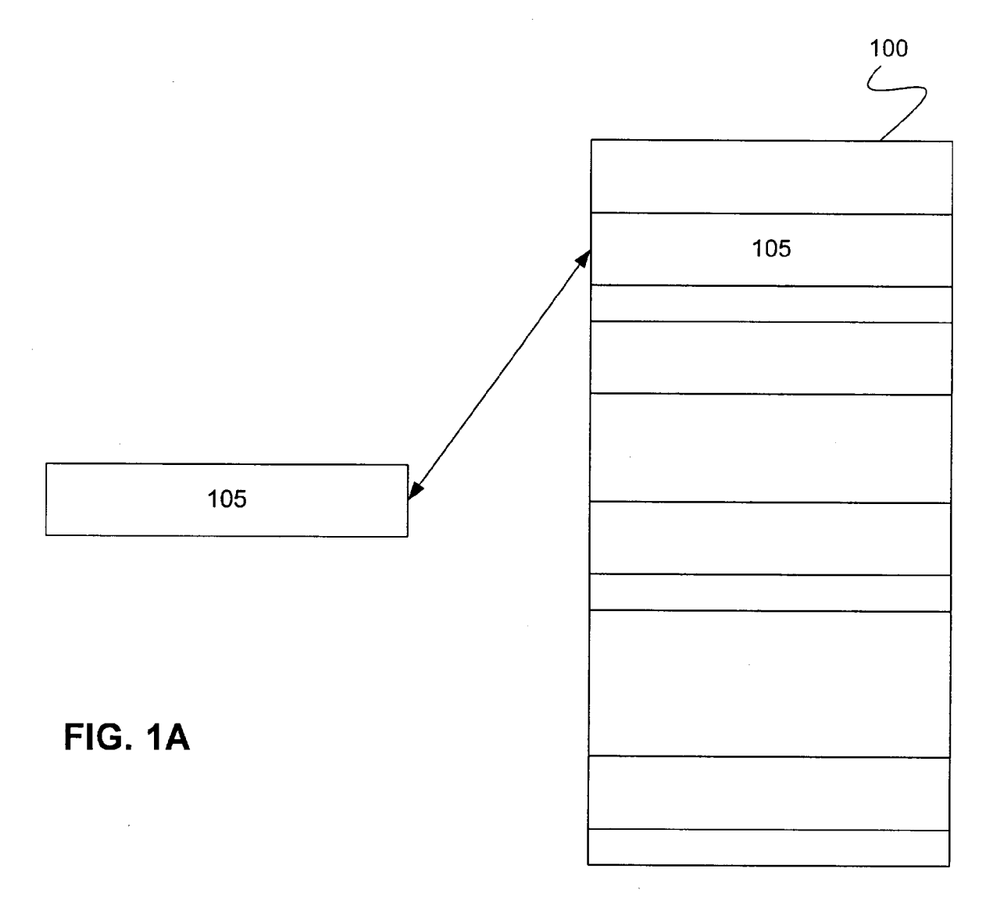
FIG. 1A illustrates an example of a computer rack.

FIG. 1A illustrates an example of a computer rack. The computer rack 100 may include a group of computer systems including computer system 105. Each computer system in the group of computer systems may be configured to perform a different computing role such as, for example, network server, router, etc. The computer rack 100 may be positioned in a closed off room. The room may be heavily air-conditioned to maintain a suitable operating temperature for the computer systems included in the computer rack 100. The room may have other computer racks (not shown) similar to the computer rack 100, and these other computer racks may include other computer systems. The room may be located in a data center, and its size may vary.

Figure 1B:
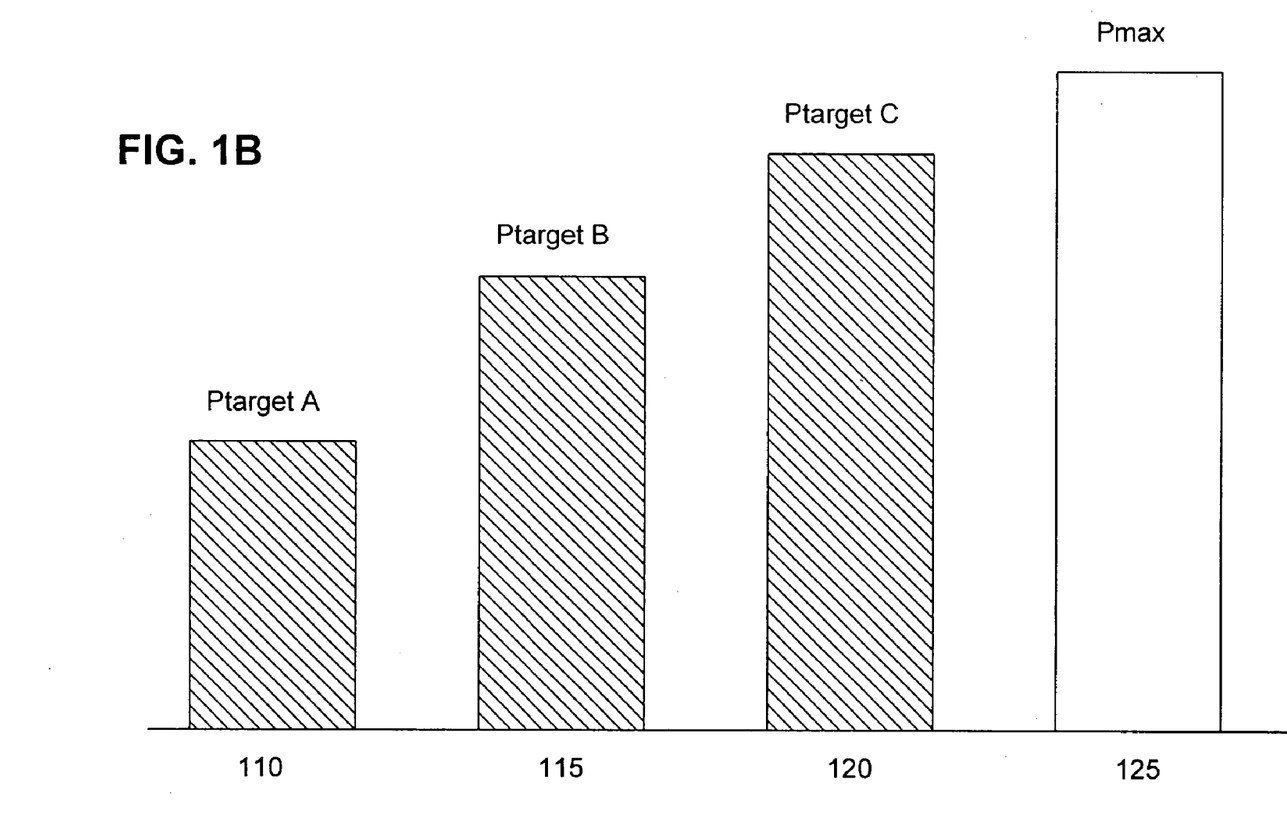
FIG. 1B is a diagram illustrating examples of different target power consumption levels and a power specification for a computer system.

The computer rack 100 may be associated with a certain power and cooling capacity. Typically, data center administrators may use a power specification specified by computer system manufacturers to determine the number of computer systems that may be included in a computer rack. FIG. 1B is a diagram illustrating examples of different target power consumption levels and a power specification for a computer system. The power specification 125 of a computer system may be referred to as $P_{MAX}$. In many cases, an aggregate of $P_{MAX}$ for all computer systems included in the computer rack 100 may be used to determine how the computer rack 100 is populated. With each new generation of computer systems, there may be a higher power specification. As a result, the number of computer systems that may be included in a computer rack such as, for example, the computer rack 100, may decrease.

The power specification 125 ($P_{MAX}$) provided by the computer system manufacturers may be over-estimated. That is, the power specification 125 ($P_{MAX}$) may be a lot higher than an actual power consumption level of the computer system. This may be because most computer systems are not fully configured with components to their capacity. Even when a computer system is fully configured, the components may not necessary be the most power hungry components as estimated by the computer system manufacturers. For the data centers that store many computer systems, determination of necessary power based on the power specification 125 ($P_{MAX}$) may result in unnecessary demand on the supporting infrastructure including, for example, unnecessary computer racks and cooling capacity.

For one embodiment, each computer system included in the computer rack 100 is associated with one or more target power consumption levels. The target power consumption level may be referred to as $P_{TARGET}$. The $P_{TARGET}$ may be set to be less than or equal to the $P_{MAX}$. For example, referring to FIG. 1B, there may be three different target power consumption levels 110, 115, and 120 (or $P_{TARGET\ A}$, $P_{TARGET\ B}$, $P_{TARGET\ C}$). For one embodiment, the $P_{TARGET}$ may be used to allocate power to the computer system. Using the $P_{TARGET}$ 110, 115 or 120 may allow better utilization and improved efficiency of the supporting infrastructure including, for example, available power and cooling capacity. For example, at time t1, the target power consumption level 110 ($P_{TARGET\ A}$) may be set for the computer system 105. At time t2, when the power consumption level of the computer system 105 approaches the target power consumption level 110 ($P_{TARGET\ A}$), additional power may be allocated to the computer system 105. To do that, the target power consumption level 115 ($P_{TARGET\ B}$) may be set for the computer system 105. Similarly, at time t3, when the power consumption level of the computer system 105 approaches the target power consumption level 115 ($P_{TARGET\ B}$), additional power may be allocated to the computer system 105 using the target power consumption level 120 ($P_{TARGET\ C}$). It may be noted that the amount of power allocated to the computer system 105 is less than the amount of power allocated when the power specification 125 ($P_{MAX}$) is used. It may also be noted that additional power may be allocated when there is available power.

The $P_{TARGET}$ may be set based on several factors. These factors may include, for example, the number of components in the computer system, the workload, available power capacity, available cooling capacity, performance requirement, environmental requirement, administrative requirement, etc. The $P_{TARGET}$ may be set using a manual approach or an automatic approach. For example, a manual approach may involve using a typical workload to determine a highest power consumption level of the computer system 105. A percentage (e.g., 5%) may then be used as a safe guard to arrive at the $P_{TARGET}$. As another example, the $P_{TARGET}$ may be set by automatically monitoring the power consumption level of the computer system 105 over a period of time during peak usage hours and calculate an average power consumption level. For one embodiment, the $P_{TARGET}$ may be determined using the techniques described in the application titled "METHOD TO ESTIMATE POWER AND COOLING REQUIREMENTS OF SYSTEMS" filed on Dec. 13, 2001 having Ser. No. 10/022,448. Other techniques may also be used to establish the $P_{TARGET}$.

Power Throttling

The computer system 105 may use the $P_{TARGET}$ to determine when to begin to throttle power to one or more components in the computer system 105. For example, the power to a disk drive (not shown) in the computer system 105 may be reduced so that the power consumption of the computer system 105 may remain less than or equal to the target power $P_{TARGET}$. For one embodiment, power to one or more components within a computer system may be throttled using the techniques described in the application titled "METHOD AND APPARATUS TO MANAGE USE OF SYSTEM POWER WITHIN A GIVEN SPECIFICATION" filed on Jan. 02, 2002 and having Ser. No. 10/037,391. Other power throttling techniques may also be used.

Figure 2:
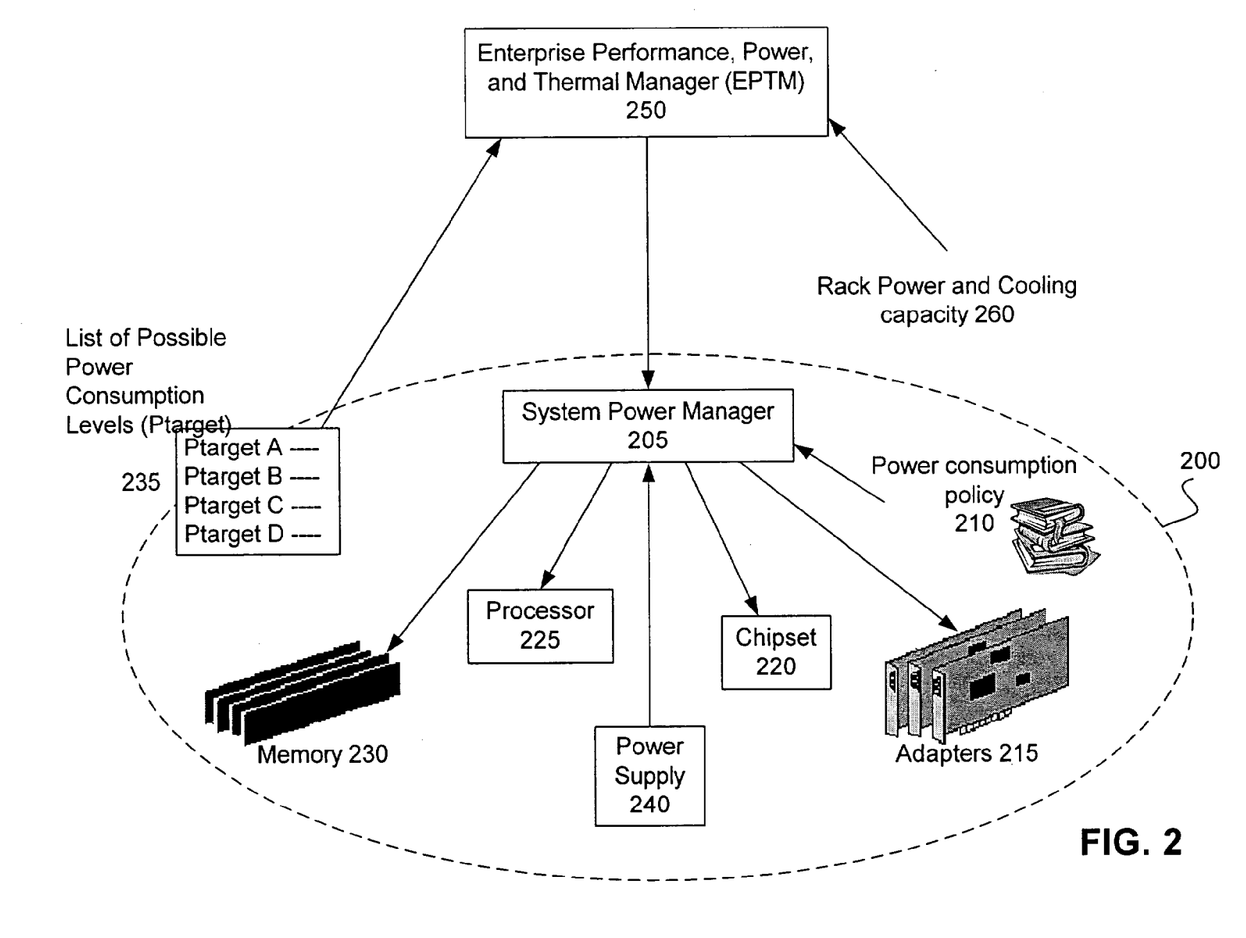
FIG. 2 is a block diagram illustrating an example of a controller used to improve efficiency of supporting infrastructure, according to one embodiment.

FIG. 2 is a block diagram illustrating an example of a controller used to improve efficiency of supporting infrastructure, according to one embodiment. The controller may be referred to as an enterprise power and thermal manager (EPTM). In this example, computer system 200 may include multiple components (e.g., processor 225, chipset 220, memory 230, etc.). For one embodiment, system power manager 205 may receive information about a current power consumption level of the computer system 200 from power supply 240. For example, the power supply 240 may provide a port (not shown) to allow the system power manager 205 to extract information about the current power consumption level of the computer system 200. Other techniques may also be used to provide the current power consumption level of the computer system 200. For example, the components may report their power consumption directly to the system power manager 205.

The system power manager 205 may be responsible for monitoring and managing the power consumption of one or more components in the computer system 200. The system power manager 205 may use power consumption policy 210 to manage the power consumption of the components so that appropriate power increase or decrease action may be taken when necessary. For example, when a current power consumption level of the computer system 200 is approaching the $P_{TARGET}$, the system power manager 205 may use information provided by the power consumption policy 210 to determine how to decrease the power to the one or more components. Decreasing the power to the one or more components may affect the performance of the components and of the computer system 200 while keeping the current power consumption level to be near or below the $P_{TARGET}$.

For one embodiment, because the workload may change frequently it may be advantageous to be able to dynamically set the $P_{TARGET}$ to accommodate different power requirements. For example, when the target power consumption level 110 ($P_{TARGET\ A}$) is used, and the current power consumption level is approaching the target power consumption level 110 ($P_{TARGET\ A}$), instead of throttling the power to the components, a next target power consumption level 115 ($P_{TARGET\ B}$) is set. Of course, setting the target power consumption level 115 ($P_{TARGET\ B}$) may include verifying that there is sufficient available power to allocate to the computer system to support the target power consumption level 115 ($P_{TARGET\ B}$). For one embodiment, power throttling and setting a next target power consumption level may be used together when the current level of power consumption is at a level that requires such actions. It may be noted that when the $P_{TARGET}$ is set too high, the power allocated to the computer system 200 may not be fully utilized.

Power, and Thermal Management System

The power and thermal manager (EPTM) 250 illustrated in FIG. 2 may manage power allocated to the computer system 200 based on power and cooling capacity 260. Other factors (e.g., performance, etc.) may also be used by the EPTM 250 to manage the power allocated to the computer system 200. The computer system 200 may be one of multiple computer systems located in a rack such as, for example, the rack 100 illustrated in FIG. 1. The data center administrators may determine the power and cooling capacity 260.

The EPTM 250 may communicate with the computer system 200 via the system power manager 205 in the computer system 200. This may be with in-band channel such as, for example, a local area network (LAN), or inter-application communication, or out-of-band channel such as, for example, a bus. Other techniques may also be used to allow the EPTM 250 to communicate with the computer system 200. The EPTM 250 may indicate to the system power manger 205 the amount of power that the EPTM 250 is allocating to the computer system 200. This allocated amount of power may be provided via the power supply 240. This allocated amount of power may be based on a set target power consumption level $P_{TARGET}$. The EPTM 250 may also inquire the computer system 200 about its current power consumption level. The EPTM 250 may ask for a history of power consumption levels or a power consumption level at a specific time.

For one embodiment, the computer system 200 may be associated with one or more target power consumption levels ($P_{TARGET}$). Each $P_{TARGET}$ may be used by the EPTM 250 to allocate an appropriate amount of power to the computer system 200. For one embodiment, a list of the different target power consumption levels 235 may be stored in the computer system 200 and may be provided to the EPTM 250. For example, when the computer system 200 is idle and may operate at a low target power consumption level, the low target power consumption level may be set, and the EPTM 250 may allocate a small amount of power to the computer system 200 accordingly.

Figure 3:
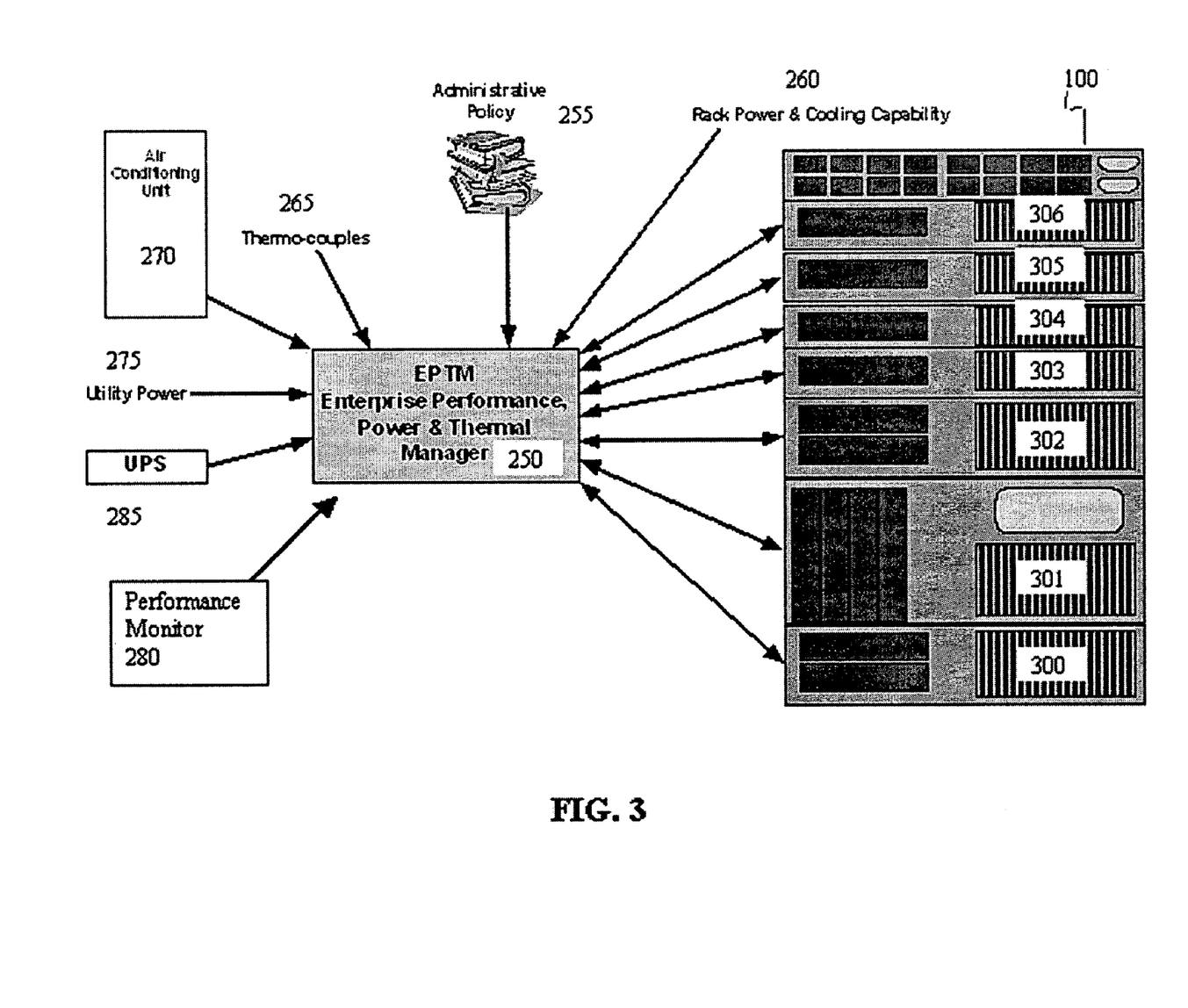
FIG. 3 is a block diagram illustrating an example of a controller when used to manage a group of computer systems located in a computer rack, according to one embodiment.

FIG. 3 is a block diagram illustrating an example of a controller when used to manage a group of computer systems located in a computer rack, according to one embodiment. EPTM 250 may manage one or multiple of computer racks (not shown) in addition to the computer rack 100. Management of the power allocated to the computer systems 300–306 in the computer rack 100 may depend on the role of each of the computer systems 300–306. For example, the computer system 300 may function as a high priority network router, and the EPTM 250 may allocate as much power to the computer system 300 as it may need. This allocation may affect the power allocated to the remaining computer systems 301–306 located on the same rack as the computer system 300. In addition to receiving information relating to the power and cooling capacity 260, the EPTM 250 may receive information about alternative power sources such as, for example, the uninterrupted power-supply (UPS) 285 or other backup generators (not shown). The EPTM 250 may receive status information about the utility power 275 that provides power. The EPTM 250 may also receive status information about elements of cooling systems such as air conditioning unit 270 that provides cool air to the computer rack 100. Other examples of elements of cooling systems include but not limited to heat exchanger (not shown).

The EPTM 250 may use an administrative policy 255 to allow the EPTM 250 to, for example, adjust the $P_{TARGET}$ of each of the computer systems 300–306 to accomplish certain tasks. The administrative policy 255 may be handled by a policy handler (not shown) that communicates the appropriate policy to the EPTM 250. For example, some computer systems may be designated by the administrative policy 255 as higher priority or higher performance, so it may be necessary for the EPTM 250 to prioritize allocation of power to these computer systems. Thus, the EPTM 250 may allocate power to these computer systems at the expense of other computer systems located in the computer rack 100. The administrative policy 255 may direct the EPTM 250 to reduce power or cooling (e.g., 10%) to the computer rack 100, for example, in order to reduce expense. The administrative policy 255 may direct the EPTM 250 to adjust the $P_{TARGET}$ of each of the computer systems 300–306 in order to alter the pattern of power consumption to take advantage of a possible "time of day metering" of utility power supply 275.

For one embodiment, the EPTM 250 may also receive information from a performance monitor 280. The performance monitor 280 may be a system that monitors performance and/or workload of one or more computer systems 300–306 located in the computer rack 100. An example of performance monitor 280 may be a network load balancer. The performance monitor 280 may request the EPTM 250 to adjust the $P_{TARGET}$ of each of the computer systems 300–306 based on the current workload. This may include using a higher $P_{TARGET}$ to deliver a higher performance. In another example, the performance monitor 280 may act as a load balancer and shift workload among in the computer systems 300–306 in order to maximize power savings for a given workload. The performance monitor 280 may be a separate computer system from the EPTM 250, or it may be part of the EPTM 250 or part of one or more of the computer systems 300–306.

For one embodiment, the EPTM 250 may also receive information from thermo couples 265. The thermo couples 265 may receive thermal inputs from each or some of the computer systems, the computer rack 100, and/or the room or data center where the computer rack 100 is located. The information received from the thermo couples 265 may allow the EPTM 250 to manage the cool air required to keep the computer systems 300–306 in an acceptable operating condition. Based on the information received from the thermocouples, EPTM 250 may reduce the $P_{TARGET}$ to one or more computer systems 300–306 in order to cool those computer systems.

For one embodiment, the EPTM 250 may receive information that indicates status of source of electrical energy such as power from utility companies, uninterruptible power supplies (UPS) or back up generators such as generators that work on diesel engines, for example. A data center may experience an electrical crisis when either the back up generators and/or the UPS systems fail due to a shortage (or some other reasons) because the utility power company cannot satisfy the full demand. A traditional way to address this crisis is to power off one or more computer systems. For one embodiment, the EPTM 250 may reduce the $P_{TARGET}$ of one or more computer systems to reduce over all power consumption. This may allow all of the computer systems in the computer rack 100 to continue to operate with minimal down time. Depending upon a combination of the workloads, the current power consumption level, and the $P_{TARGET}$ for a computer system, this may or may not have impact on the performance of the computer system.

Power Allocation with Available Power

Figure 4A:
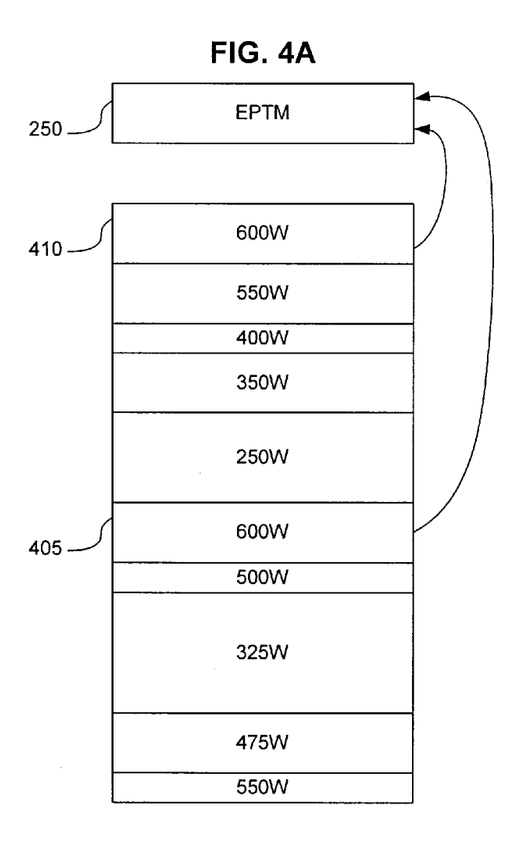
FIGS. 4A and 4B illustrate one example of power allocation performed by the EPTM, according to one embodiment.
Figure 4B:
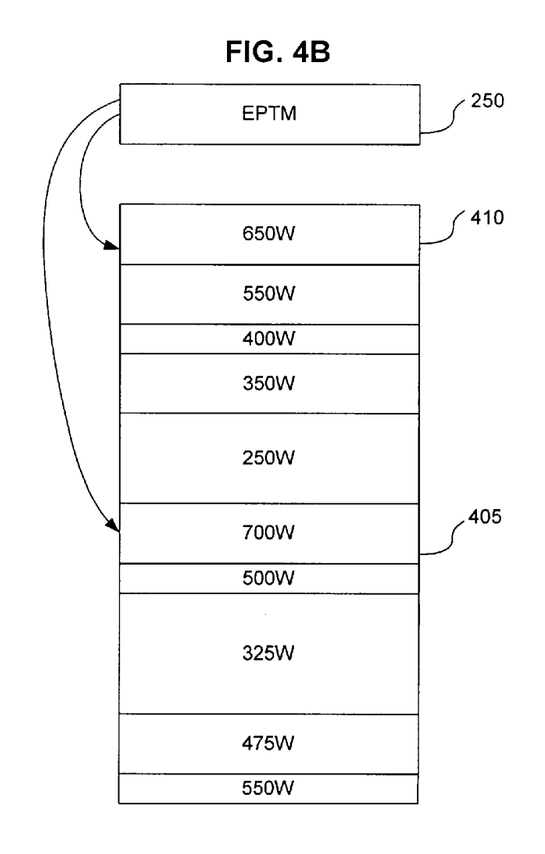

FIGS. 4A and 4B illustrate one example of power allocation performed by the EPTM, according to one embodiment. FIGS. 4A and 4B include the same EPTM 250 and computer rack with the same computer systems. The rack in this example may be capable of delivering and cooling 6000 Watts. The computer systems include computer systems 405 and 410. The $P_{TARGET}$ for each computer system in the rack may be set at 600 Watts. The $P_{TARGET}$ for each computer system may be less than its power specification $P_{MAX}$. Each computer system illustrated in FIG. 4A may be associated with a $P_{TARGET}$.

Each computer system may be operating at a current power consumption level. The current power consumption level may be below or near the $P_{TARGET}$. In this example, the $P_{TARGET}$ associated with the computer systems 405 and 410 may be set at 600 Watts. It may be noted that the current power consumption levels of the computer systems 405 and 410 illustrated in FIG. 4A are also at 600 Watts, and the total power consumption of all of the computer systems in the rack in FIG. 4A is at approximately 4700 Watts. In this example, because the power capacity of the rack is 6000 Watts, there is 1300 watts (6000–4700) of available power for the EPTM 250 to allocate when necessary. The EPTM 250 may use the available power to satisfy requests for additional power from one or more computer systems.

As illustrated in FIG. 4A, the current power consumption levels of the computer system 405 and 410 have reached their $P_{TARGET}$ of 600 Watts and may request the EPTM 250 for additional power. In this example, this is illustrated as directional arrows from the computer systems 405 and 410 to the EPTM 250. The EPTM 250 may respond to the requests by dynamically allocating the available power to the computer systems 405 and 410. For example, the EPTM 250 may set the target power consumption level $P_{TARGET}$ for each of the computer systems 405 and 410 to a next higher target power consumption level and then allocate power to the computer systems 405 and 410 based on these higher $P_{TARGETS}$, and the available 1300 watts. In this example, the power allocated to the computer system 405 is increased from 600 Watts to 700 Watts, and the power allocated to the computer system 410 is increased from 600 Watts to 650 Watts, as illustrated in FIG. 4B. This is illustrated as directional arrows from the EPTM 250 to the computer systems 405 and 410. Higher allocation of power may allow the computer systems 405 and 410 to deliver higher performance. In this example, because there is available power, the EPTM 250 may be able to satisfy the requests of the computer systems 405 and 410 with minimal effect to the performance of the other computer systems in the rack. It may be noted that when a safeguard range is added to the $P_{TARGET}$, and the computer systems 405 and 410 may generate the requests before their current power consumption levels reach their appropriate $P_{TARGET}$.

Power Allocation with Evaluation of Allocated Power

Figure 5A:
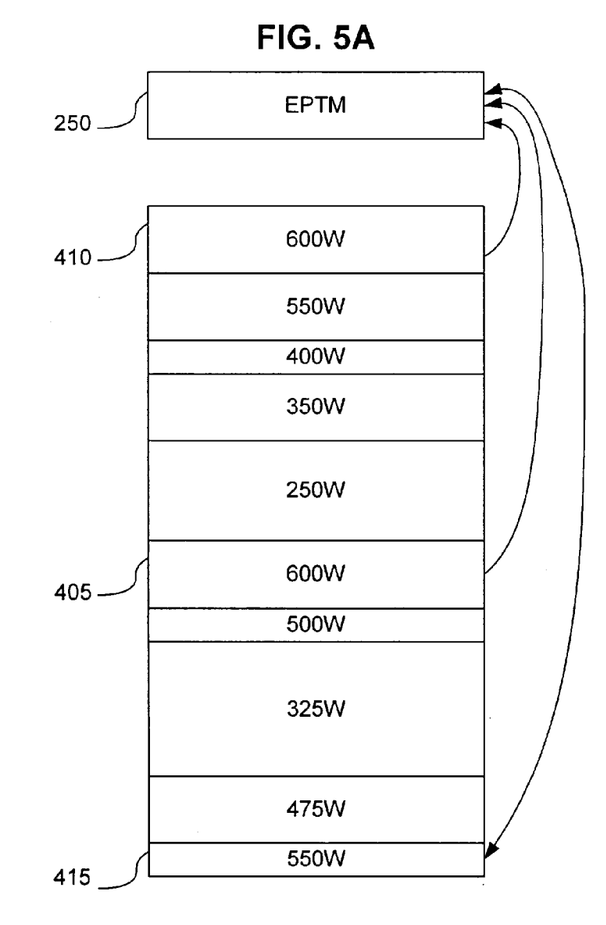
FIGS. 5A and 5B illustrate another example of power allocation performed by the EPTM, according to one embodiment.
Figure 5B:
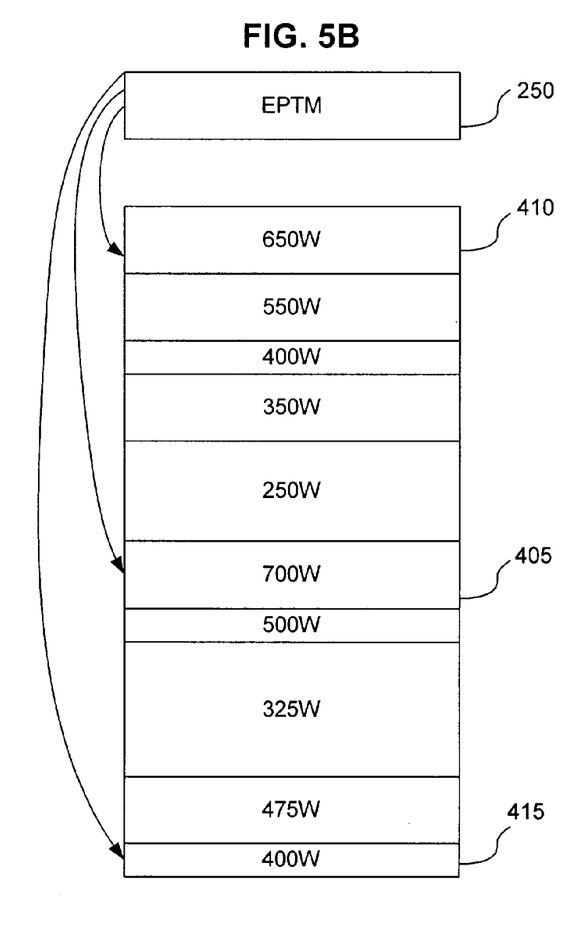

FIGS. 5A and 5B illustrate another example of power allocation performed by the EPTM, according to one embodiment. In this example, the computer systems 405 and 410 request the EPTM to allocate more power. In certain situations, there may not be enough available power to satisfy requests for additional power, unless further actions are performed. For example, there may not be any available power. For one embodiment, the EPTM 250 may evaluate the $P_{TARGET}$ of each of the computer systems in the rack against its current power consumption level. The EPTM 250 may not need to evaluate the current power consumption levels of the computer systems 405 and 410 because they initiate the requests for more power and thus may already be operating at their $P_{TARGET}$.

As described above, each computer system may be associated with more than one $P_{TARGET}$. For example, the EPTM 250 may examine the list of possible target power consumption levels 235 (described in FIG. 2) for each computer system to determine if the EPTM 250 can direct that computer system to operate at a lower target power consumption level. Referring to the example illustrated in FIGS. 5A and 5B, the EPTM 250 may determine that the computer system 415 can operate at a lower $P_{TARGET}$ and may therefore reduce the power allocated to the computer system 415 from 550 Watts to 400 Watts. The reduced power (150 Watts) taken from the computer system 415 may then be re-allocated to the computer system 410 (50 Watts) and the computer system 405 (100 Watts). It may be noted that the EPTM 250 may need to reduce the power allocated to more than one computer system to satisfy the request. It may also be noted that the computer systems that EPTM 250 reduces the power from may be idle or may not be very busy such that there may be minimal effect on their performance.

For one embodiment, the computer system that generates the request for more power may wait for a predetermined amount of time to allow the EPTM 250 to determine available power and to allocate the necessary power to satisfy the request. For one embodiment, when the EPTM 250 cannot satisfy a request for more power by a computer system, the power manager 205 (described in FIG. 2) associated with that computer system may be activated to throttle power consumption of one or more components of the computer system.

It may be noted that a computer system may or may not be associated with more than one target power consumption level. Furthermore, when the computer system is associated with more than one target power consumption level, it may be not be necessary for the EPTM 250 to use the different target power consumption levels to manage the power allocated to the computer system.

Power Management

Typically, the electricity for the data centers (including for example the computer systems in the computer rack 100) is provided by power utility companies. There may be situations when level of power provided by the power utility company may fluctuate. In those situations, the amount of available power may sometimes be lower than desirable in order to keep the computer systems in the data center operational. When there is no other power source to make up for the power fluctuation, the data center administrators may resolve to power down one or more computer systems to reduce demand for the power. Powering down the computer systems may result in, for example, lack of service, reduction in opportunity to generate revenue, reduced availability, etc. For one embodiment, when there is a power fluctuation, a power fluctuation warning may be generated, and the EPTM 250 may be used to reduce the level of power available to one or more computer systems and/or to bring the overall demand for power by the computer systems in line with the available power. For example, when the EPTM 250 recognizes that the available power is reduced by 50%, the EPTM 250 may lower the target power consumption levels of each of the computer systems accordingly. Since this may be achieved without shutting down the computer systems, availability may be maintained. It may be noted that the computer systems may need to perform power throttling to one or more of its components to cope with the lower target power consumption levels.

The data center administrators may use uninterruptible power supply (UPS) systems in case problems occur in receiving the power from the power utility companies. Many data center administrators may also use various other backup power generators in case of long failures in the power provided by the power utility companies. For one embodiment, the EPTM 250 may be used to reduce the level of power available to the one or more computer systems when one or more UPS systems fail. For example, when there is a failure in receiving the power from the power utility companies, and when there is a failure with the UPS systems, the data center administrators may switch to the backup power generators to make up for the fluctuation of power. In these situations, the EPTM 250 may lower the target power consumption levels of each of the computer systems accordingly to be in line with the amount of power generated by the backup power generators. Similarly, when the backup power generators fail, the EPTM 250 may take appropriate actions based on the available power to keep the computer systems operational. In this example, it may be noted that depending on the current workload of each of the computer systems, its performance may or may not be impacted by the actions of the EPTM 250.

Thermal Management

While operational, each of the computer systems in the data center may generate thermal energy or heat. This heat may be removed by circulating cool air generated by the air conditioning system in the data center. Most air conditioning systems have moving components such as, for example, fans, compressor, etc., and they may be subjected to failure. In an event when one or more of these components fail, the cooling capacity of the data center may be reduced. Unless the power consumption levels of the computer systems are also reduced during such an event, the temperature in the data center may rise, and the components in the computer systems may fail. Typically, to prevent the undesirable rise in temperature, the data center administrators may need to reduce the power consumption levels of the computer systems by powering off one or more computer systems. This may result in loss of service, reduced availability, etc. For one embodiment, when there is insufficient cool air, a temperature warning may be generated, and the EPTM 250 may lower the target power consumption levels of the computer systems. This may help keep the computer systems operational without having to be powered off.

The distribution of cool air in the data center may not be uniform. This means that some areas of the data center may be cooler than others. An area where there is less cool air may be referred to as a hotspot. Computer systems located in a hot spot may be more prone to fail because of the higher temperature than those computer systems not located in a hot spot. To make matter worse, the hot spots may vary due to, for example, human actions. For one embodiment, each computer rack such as, for example, computer rack 100 is associated with a thermocouple to measure the temperature within its vicinity. For another embodiment, each computer system is also associated with a thermocouple. This may be done whether the computer systems are located in the hot spots. For one embodiment, the temperature measured by the thermocouples is sent to the EPTM 250. The EPTM 250 may then use this information to reduce the power consumption of the computer system. For example, the EPTM 250 may lower the target power consumption levels of the computer systems whose thermocouples indicate high temperature. This may help reduce the thermal output, and as a result may help reduce the air temperature in or around those computer systems.

Implementation of Administrative Policies

For one embodiment, the EPTM 250 may also be used to implement different administrative policies. This may be in addition to the EPTM 250 being able to set the target power consumption levels for multiple computer systems to cope with the available power and cooling capacity. The administrative policies may create opportunities for cost saving, increased revenue generation, increased availability, improved performance, etc. For cost saving, the EPTM 250 may be used to reduce the power consumption of the computer systems in order to reduce the power and cooling costs by, for example, 10%. This may be referred to as a cost-based administrative policy.

To increase revenue, the EPTM 250 may be used to maintain different power and cooling capacity for different computer racks (e.g., 2000 Watts rack, 3000 Watts rack, etc.). The clients may be charged based upon the capacity or a service level they are willing to pay for. This may be referred to as a fee-based administrative policy.

Some power utility companies may change their rate for electricity based upon time of the day of use. For one embodiment, the EPTM 250 may use this rate information and implement a time-based policy to set the target power consumption level to take advantage of the different power rates. This may be referred to as a rate-based administrative policy.

For one embodiment, the EPTM 250 may keep a log of data relating to the power consumption levels of one or more computer systems. The data may then be analyzed to enable the EPTM 250 to recognize future power needs of the one or more computer systems and thus preempting requests for more power. For example, EPTM 250 may notice that a particular web server computer system has a much larger workload (thus higher power consumption level) between 8 AM and 10 AM during weekdays from week 1 to week 50 of the year. As a result, the EPTM 250 may change the target power consumption level ($P_{TARGET}$) for the web server computer system to a higher target power consumption level just before 8 AM on weekdays in week 1 through 50. The EPTM 250 may then change the target power consumption level ($P_{TARGET}$) for the web server computer system to a lower target power consumption level just after 10 AM, for example. This may be referred to as a time-based administrative policy. This policy may reduce any latency involved in waiting for the computer system to demand for the additional power and for the actual power allocation by the EPTM 250. For one embodiment, the EPTM 250 may employ one or more of the cost-based policy, fee-based policy, rate-based policy, and time-based policy.

Process to Request for More Power

Figure 6:
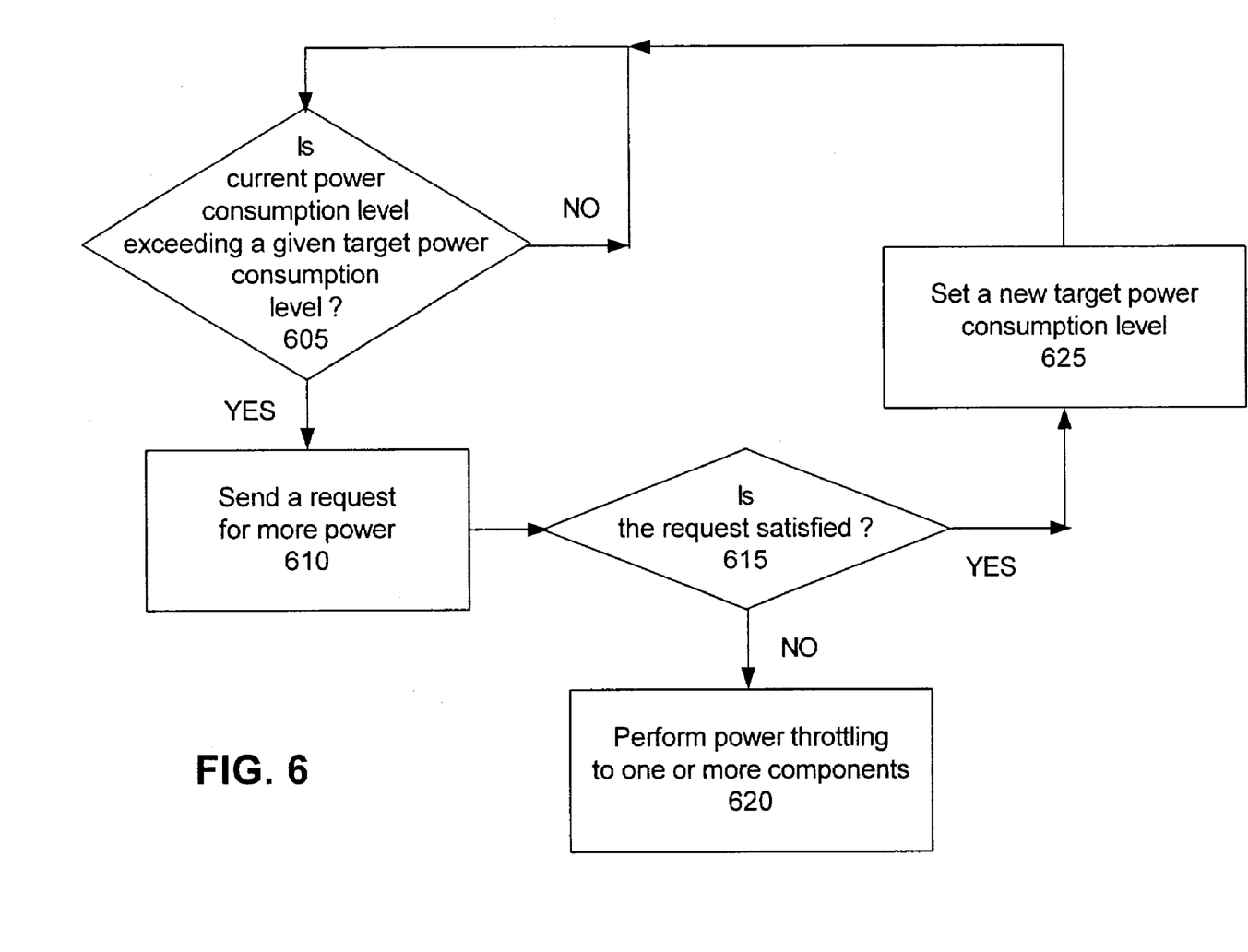
FIG. 6 is a block diagram illustrating a process performed by a computer system to request for more power, according to one embodiment.

FIG. 6 is a block diagram illustrating a process performed by a computer system to request for more power, according to one embodiment. The request may be sent to the EPTM 250 as described above. At block 605, a test is made to determine if a current power consumption level may exceed a target power consumption level. From block 605, when the current power consumption level does not exceed the target power consumption level, the target power consumption level (and correspondingly the current amount of allocated power) may remain acceptable. In that case, the process may remain at block 605 until a time when the current power consumption level exceeds the target power consumption level. When the target power consumption level is exceeded, a request for more power may be generated, as shown in block 610.

After the request for more power is generated in block 610, the process may wait for a response from the EPTM 250. Alternatively, the process may wait for a predetermined time period and regardless whether a response is received from the EPTM 250, the process flows to block 615 to determine if the request is satisfied. When the request cannot be satisfied, or when a response is not received within the predetermined time period, the process flows from block 615 to block 620 where the computer system may need to throttle the power consumption of one or more of its components in order to keep its current power consumption level in line with its set target power consumption level. From block 615, when the request can be satisfied, a new target power consumption level is set, as illustrated in block 625. The process then flows from block 625 to block 605 where the computer system may continue to monitor its current power consumption level and compare against the new target power consumption level. It may be noted that a threshold may be used with the target power consumption level so that when the current power consumption level is near the target power consumption level, the request for more power may be generated.

Process to Address Request for Additional Power

Figure 7:
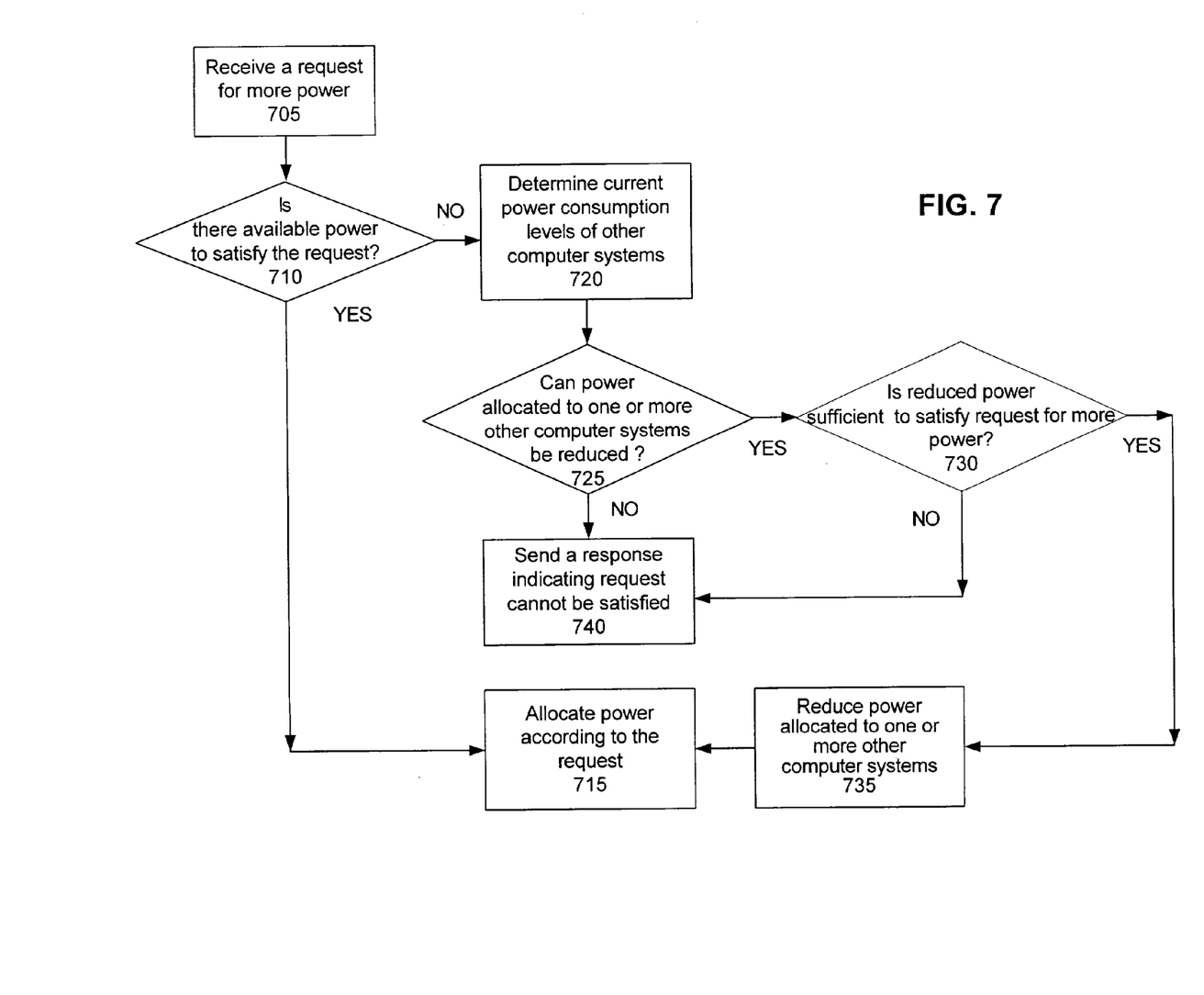
FIG. 7 is a flow diagram illustrating an example of a power allocation process using an EPTM, according to one embodiment.

FIG. 7 is a flow diagram illustrating an example of a power allocation process using an EPTM, according to one embodiment. The process may be performed by the EPTM 250 described above. At block 705, a request for more power is received by the EPTM 250. The request may be generated by a computer system in a group of computer systems managed by the EPTM 250. For example, the group of computer systems may be installed in a computer rack such as the computer rack 100 illustrated in FIG. 1. For one embodiment, the EPTM 250 may monitor the current level of power consumption of one or more computer systems and may on its own recognize when the monitored computer systems may need additional power and dynamically determine if additional power may be allocated. In this situation, the monitored computer systems may not need to generate the requests.

At block 710, a test is made to determine if there is sufficient power available to satisfy the request. Power may be available if the EPTM 250 has not allocated all of the available power to the group of computer systems, as in the example illustrated in FIG. 4A. When there is available power to satisfy the request, the process flows from block 710 to block 715 and the request for more power is satisfied. This may include the EPTM 250 allocating more power to the computer system that generates the request.

From block 710, when there is not enough available power to satisfy the request, the process flows to block 720 where the current power consumption level of each of the other computer systems in the group of computer system is determined. At block 725, a test is made to determine if the set target power consumption level ($P_{TARGET}$) for each of the other computer systems in the group may be reduced. As described above, the set target power consumption level ($P_{TARGET}$) may be used to determine the amount of power allocated to the computer system. This may be less than the power specification ($P_{max}$) suggested by the computer system manufacturer. For example, the test may determine if each computer system may be able to operate at a lower target power consumption level based on its current activities and workload.

From block 725, when the power allocated to all of the other computer systems cannot be reduced, the process flows to block 740. At block 740, a response may be generated to indicate that the request for more power cannot be satisfied. From block 725, when the power allocated to one or more other computer systems may be reduced, the process flows to block 730.

At block 730, a test is made to determine if the power resulting from reducing the power allocated to the one or more other computer systems is going to be sufficient to satisfy the request for more power. If not, the process flows from block 730 to block 740 and the request cannot be satisfied. However, if the result from block 730 is yes, the process flows to block 735 where the power allocated to these other computer systems may be reduced. This may include setting a lower target power consumption level for each of these other computer systems. The process then flows from block 735 to block 715 where the power may be allocated to the computer system that generated the request for more power.

Process to Re-Evaluate Allocated Power

Figure 8:
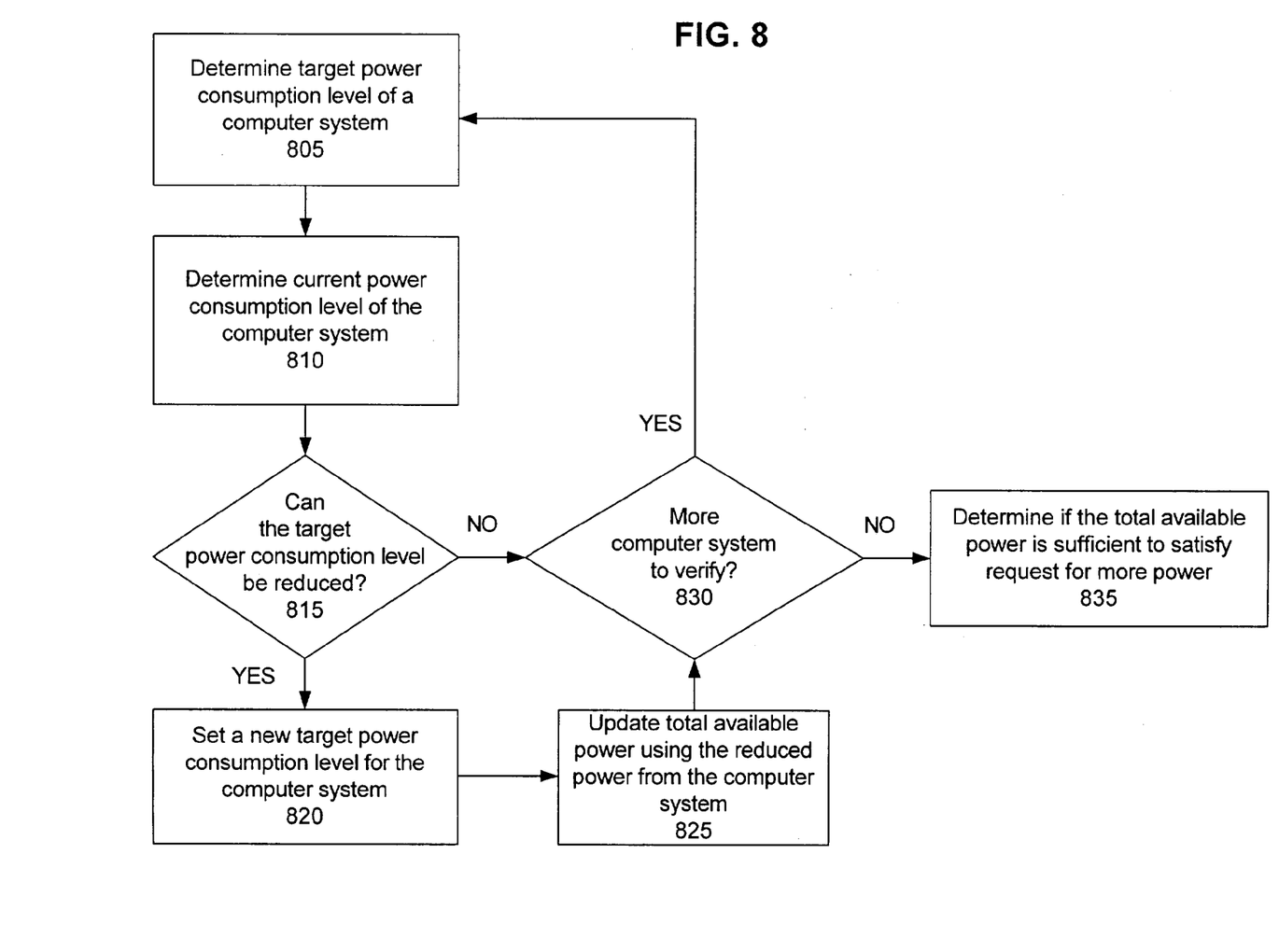
FIG. 8 is a block diagram illustrating an example of a process used to re-evaluate the target power consumption level for each computer system in a group of computer systems, according to one embodiment.

FIG. 8 is a block diagram illustrating an example of a process used to re-evaluate the target power consumption level for each computer system in a group of computer systems, according to one embodiment. At block 805, the target power consumption level for each of the computer systems in the group (except may be for the computer system that generated the request for more power) is determined. As described above, the power allocated to a computer system is based on the target power consumption level that the computer system may be set at.

At block 810, a current power consumption level of the computer system is determined. The current power consumption level may be less than or near the target power consumption level. At block 815, a comparison is performed to determine if the current power consumption level is lower than the target power consumption level such that it may be possible to lower the target power consumption level without causing too much impact on the performance of the computer system. For example, the computer system may be consuming power at a level that corresponds to a lower target power consumption level. In this situation, the target power consumption level for the computer system may be changed to a lower target power consumption level. When the target power consumption the computer system cannot be changed (e.g., the computer system can operate at only one target power consumption level), the process flows from block 815 to block 830. At block 830, a test is made to determine if there are other computer systems in the group that may need to be verified for possible reduction of allocated power.

At block 815, when the target power consumption level for the computer system may be reduced, the process flows to block 820 where a new lower target power consumption level is set. The new target power consumption level may correspond to a lower amount of allocated power for the computer system. This may mean that more power is becoming available. At block 825, a cumulative amount of available power is updated. The process then flows to block 830 to determine if there are other computer systems in the group that may need to be verified for possible reduction of allocated power. From block 830, when all of the computer systems are verified, the process flows to block 835 where the cumulative amount of available power is used to determine if it is sufficient to satisfy the request for more power.

The process in FIG. 8 may attempt to reduce the power of all of the other computer systems in the group before determining if the request can be satisfied. Alternatively, the process in FIG. 8 may not need to attempt to reduce the power of all of the computer systems, but instead only to reduce the power of some of the computer systems in the group until the request may be satisfied. It may be possible that even when the process attempts to reduce the power of all of the computer systems, the amount of available power may not be enough to satisfy the request. For example, each of the computer systems may already be operating at a power consumption level at or near its corresponding target power consumption level.

It may be noted that the EPTM 250 may or may not reevaluate the power allocated to each of the computer systems. For example, when a request for more power is received, the EPTM 250 may not satisfy the request because there is not sufficient available power, even though the other computer systems may not be fully utilizing their allocated power. Alternatively, the EPTM 250 may perform the reevaluation as described in FIG. 8 to satisfy the request.

Computer System

The operations of the various embodiments of the present invention may be implemented by a processing unit in a computer system, which executes sequences of computer program instructions. The EPTM 250 may be implemented in software, in hardware or in a combination of both software and hardware. For example, the EPTM 250 may be implemented as a chip or chipset with hardware circuitry that includes an auxiliary processor dedicated to performing functions of power, performance and thermal management. The chip or chipset may further include internal memory, and bus connections to the components (e.g., system CPU, system memory, etc.) in the computer system. The chip or chipset may also include bus connection(s) to receive, for example, power requests from other computer systems such as those installed in the computer rack 100. The EPTM 250 may then be coupled to the performance monitor 280, a thermo couples 265 and a policy handler that provides one or more administrative policies 255.

Computer Readable Media

For one embodiment, the EPTM 250 (described in the examples illustrated in FIGS. 7–8) may be implemented in software, which includes instructions that are stored in a memory, which may be considered to be a machine-readable storage media. The memory may be random access memory, read-only memory, or persistent storage memory, such as mass storage device or any combination of these devices. Execution of the sequences of instruction may cause the processing unit to perform operations according to embodiments of the present invention. The instructions may be loaded into the memory of the computer system from a storage device or from one or more other computer systems (e.g. a server computer system) over a network connection. The instructions may be stored concurrently in several storage devices. Similarly, the requests for more power (described in the example illustrated in FIG. 6) generated by the computer systems that are managed by the EPTM 250 may be implemented in hardware, software or both. Thus, embodiments of the present invention are not limited to any specific combination of hardware and software, nor to any particular source for the instructions executed by the computer system.

Using a target power consumption level $P_{TARGET}$, techniques to improve efficiency of supporting infrastructure for a group of one or more computer systems have been disclosed. The techniques may be used to adjust power allocation to the group of one or more computer systems. The adjustment of power allocation may be based one or more factors including, for example, temperature, performance, workload, power capacity, cooling capacity, cost, availability, etc. The techniques may be used to implement administrative policies in managing the computer systems.

Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

The invention claimed is:

1. A method, comprising:
   managing power consumption of a first computer system by controlling power allocated to the first computer system,
   wherein when the power consumption of the first computer system is to be decreased, power allocated to the first computer system is decreased from a first target power to a second target power, and
   wherein when the power consumption of the first computer system is to be increased from the second target power to a third target power, a request is generated by the first computer system for more power to be allocated, wherein when there is not enough power to satisfy the request, power delivered to one or more components in the first computer system is throttled.

2. The method of claim 1, wherein the power allocated to the first computer system is increased when there is enough available power.

3. The method of claim 1, wherein the power consumption of the first computer system is to be decreased in response to a warning associated with the first computer system.

4. The method of claim 3, wherein the warning relates to insufficient cool air.

5. The method of claim 3, wherein the warning relates to high thermal energy.

6. The method of claim 3, wherein the warning relates to a change in available power.

7. The method of claim 1, wherein the power consumption of the first computer system is to be decreased or increased based on one or more policies.

8. The method of claim 7, wherein the one or more policies include a cost-based policy.

9. The method of claim 7, wherein the one or more policies include a time-based policy.

10. The method of claim 7, wherein the one or more policies include a fee-based policy.

11. The method of claim 7, wherein the one or more policies include a rate-based policy.

12. The method of claim 7, wherein the one or more policies include a cost-based policy, a time-based policy, a fee-based policy, and a rate-based policy.

13. A method, comprising:
defining one or more target power for a first computer system, wherein each of the one or more target power is associated with an amount of power allocated to the first computer system;
setting the first computer system at a first target power; and
when power consumption of the first computer system is near the first target power, generating a request for more power to be allocated to the first computer system, wherein when there is not enough power to satisfy the request, power delivered to one or more components of the first computer system is throttled.

14. The method of claim 13, wherein the power delivered to the one or more components of the first computer system is reduced to enable the power consumption of the first computer system to not exceed the first target power.

15. A method, comprising:
receiving a request from a first computer system to increase power allocated to the first computer system, the first computer system being in a group of two or more computer systems;
responsive to the request, re-evaluating power allocated to the two or more computer systems in the group to determine if the request can be satisfied; and
when the request cannot be satisfied, reducing power consumption of one or more components in the first computer system.

16. The method of claim 15, wherein said re-evaluating power allocated to the two or more of the computer systems does not include the first computer system.

17. The method of claim 16, wherein said re-evaluating power comprises:
comparing power consumption of a second computer system with power allocated to the second computer system to determine if the power allocated to the second computer system can be reduced.

18. The method of claim 17, wherein the power allocated to the second computer system can be reduced to a level higher than the power consumption of the second computer system.

19. The method of claim 15, wherein the request is received when power consumption of the first computer system approaches the allocated power.

20. A computer readable medium having stored thereon sequences of instructions which are executable by a system, and which, when executed by the system, cause the system to perform a method, comprising:
receiving a request from a first computer system to increase allocated power from a first amount to a second amount, the first computer system being in a group of two or more computer systems;
responsive to the request, re-evaluating power allocated to the two or more of the computer systems in the group to determine if the request can be satisfied; and
when the request cannot be satisfied, reducing power consumption of one or more components in the first computer system.

21. The computer readable medium of claim 20, wherein said re-evaluating power allocated to the two or more of the computer systems does not include the first computer system.

22. The computer readable medium of claim 21, wherein said re-evaluating power comprises:
comparing power consumption of a second computer system with an amount of power allocated to the second computer system to determine if the amount of power allocated to the second computer system can be reduced.

23. The computer readable medium of claim 22, wherein the amount of power allocated to the second computer system can be reduced to an amount higher than the current power consumption level of the second computer system.

24. The computer readable medium of claim 20, wherein the request is received when power consumption of the first computer system approaches the first amount of allocated power.

25. The computer readable medium of claim 20, wherein the first amount and the second amount are predetermined.

26. A computer readable medium having stored thereon sequences of instructions which are executable by a system, and which, when executed by the system, cause the system to perform a method, comprising:
managing power consumption of a first computer system by controlling power allocated to the first computer system,
wherein when the power consumption of the first computer system is to be decreased, power allocated to the first computer system is decreased from a first target power to a second target power, and
wherein when the power consumption of the first computer system is to be increased from the second target power to a third target power, a request is generated by the first computer system for more power to be allocated, wherein when there is not enough power to satisfy the request, power delivered to one or more components in the first computer system is throttled.

27. The computer readable medium of claim 26, wherein the power allocated to the first computer system is increased when there is enough available power to satisfy the request.

28. The computer readable medium of claim 26, wherein when there is not enough available power to satisfy the request, in addition to throttling power delivered to one or more components in the first computer system, power allocated to a second computer system is reduced.

29. The computer readable medium of claim 28, wherein the power allocated to the second computer system is reduced when power consumption of the second computer system is less than the power allocated to the second computer system.

30. The computer readable medium of claim 26, wherein the power consumption of the first computer system is to be decreased in response to a warning associated with the first computer system.

31. The computer readable medium of claim 30, wherein the warning relates to insufficient cool air.

32. The computer readable medium of claim 30, wherein the warning relates to high thermal energy.

33. The computer readable medium of claim 30, wherein the warning relates to a change in available power.

34. The computer readable medium of claim 30, wherein the warning relates to a light workload.

35. The computer readable medium of claim 26, wherein the power consumption of the first computer system is to be decreased based on one or more policies.

36. The computer readable medium of claim 35, wherein the one or more policies include a cost-based policy.

37. The computer readable medium of claim 35, wherein the one or more policies include a time-based policy.

38. The computer readable medium of claim 35, wherein the one or more policies include a fee-based policy.

39. The computer readable medium of claim 35, wherein the one or more policies include a rate-based policy.

40. A computer readable medium having stored thereon sequences of instructions which are executable by a system, and which, when executed by the system, cause the system to perform a method, comprising:
    defining one or more target power consumption levels for a first computer system, wherein each of the one or more target power consumption levels is associated with an amount of power allocated to the first computer system;
    setting the first computer system at a first target power; and
    when power consumption of the first computer system approaches the first target power, generating a request for more power to be allocated to the first computer system, wherein when there is not enough power to satisfy the request, power delivered to one or more components of the first computer system is throttled.

41. The computer readable medium of claim 40, further comprising:
    responsive to the request for more power by the first computer system,
    determining if there is enough power to satisfy the request.

42. The computer readable medium of claim 41, wherein determining if there is enough power comprises:
    determining if power allocated to a second computer system can be reduced.

43. The computer readable medium of claim 42, wherein the power allocated to the second computer system can be reduced when performance of the second computer system is not affected.

44. The computer readable medium of claim 41, further comprising:
    setting the first computer system at a second target power when there is enough power to satisfy the request.

45. The computer readable medium of claim 44, wherein the second target power is higher than the first target power.

46. A system, comprising:
    a controller to control power allocated to the first computer system and to a second computer system; and
    a performance monitor coupled to the controller, the performance monitor is to monitor performance of the first computer system and of the second computer system, wherein when the performance of the first computer system is to increase, the performance monitor requests the controller to allocate additional power to the first computer system, wherein when the request cannot be satisfied by the controller, the performance monitor is to throttle power consumption of one or more components in the first computer system.

47. The system of claim 46, wherein the controller allocates the additional power to the first computer system by reducing power allocated to the second computer system.

48. The system of claim 46, further comprising a temperature monitor coupled to the controller, wherein the temperature monitor is to monitor temperature associated with the first computer system, wherein when the temperature of the first computer system is to be decreased, the temperature monitor requests the controller to decrease power allocated to the first computer system.

49. The system of claim 46, further comprising a policy handler coupled to the controller, wherein the policy handler is to indicate to the controller a power allocation policy to follow in allocating power to the first computer system and to the second computer system.

50. The system of claim 49, wherein the power allocation policy includes a cost-based policy, a fee-based policy, a rate-based policy, and a time-based policy.

* * * * *